US012707832B2

(12) United States Patent
Yu et al.

(10) Patent No.: US 12,707,832 B2
(45) Date of Patent: Aug. 11, 2026

(54) DISPLAY PANEL WITH FLOW RATE REGULATING STRUCTURE FOR REGULATING FLOW RATE OF PROCESS LIQUID, METHOD FOR MANUFACTURING THE SAME, AND DISPLAY DEVICE

(71) Applicants: Hefei BOE Optoelectronics Technology Co., Ltd., Hefei (CN); BOE Technology Group Co., Ltd., Beijing (CN)

(72) Inventors: Kun Yu, Beijing (CN); Xingxing Song, Beijing (CN); Fude Zha, Beijing (CN); Ming Wang, Beijing (CN); Haitao Wang, Beijing (CN); Yanming Lv, Beijing (CN); Yusheng An, Beijing (CN); Qingyong Meng, Beijing (CN)

(73) Assignees: Hefei BOE Optoelectronics Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 1167 days.

(21) Appl. No.: 17/531,304

(22) Filed: Nov. 19, 2021

(65) Prior Publication Data

US 2022/0285459 A1 Sep. 8, 2022

(30) Foreign Application Priority Data

Mar. 4, 2021 (CN) ......................... 202110239434.7

(51) Int. Cl.
*H10W 70/63* (2026.01)
*H10K 59/12* (2023.01)
(Continued)

(52) U.S. Cl.
CPC ........... *H10K 59/131* (2023.02); *H10K 59/88* (2023.02); *H10K 59/12* (2023.02); *H10K 59/1201* (2023.02)

(58) Field of Classification Search
CPC ........ H10K 59/88; H10K 59/12; H10K 71/00; H10K 59/1201; H10K 59/131
See application file for complete search history.

(56) References Cited

U.S. PATENT DOCUMENTS

2018/0196296 A1* 7/2018 Li ......................... G02F 1/1339
2020/0075640 A1 3/2020 Song et al.
(Continued)

FOREIGN PATENT DOCUMENTS

CN 203365869 U 12/2013
CN 109148485 A 1/2019

OTHER PUBLICATIONS

CN 202110239434.7 first office action.

*Primary Examiner* — Eva Y Montalvo
(74) *Attorney, Agent, or Firm* — IPro, PLLC

(57) ABSTRACT

A display panel, a mask plate, a method for manufacturing the display panel, and a display device are provided. The display panel includes a display area and a peripheral area surrounding the display area, and the display panel further includes: at least two integrated chips located in the peripheral area of the display area and arranged along a boundary direction of the display area; at least one flow rate regulating structure is respectively located between two adjacent integrated chips and located on a side of the integrated chips remote from the display area, and the flow rate regulating structure is configured to adjust a flow rate of process liquid.

7 Claims, 5 Drawing Sheets

(51) Int. Cl.

| | |
|---|---|
| ***H10K 59/131*** | (2023.01) |
| ***H10K 59/88*** | (2023.01) |
| ***H10W 70/40*** | (2026.01) |
| ***H10W 74/10*** | (2026.01) |
| ***H10W 90/00*** | (2026.01) |

(56) References Cited

U.S. PATENT DOCUMENTS

2020/0348552 A1 11/2020 Ouyang et al.
2020/0357867 A1 11/2020 Song et al.
2022/0020941 A1 * 1/2022 Choi .................... H10K 77/111

* cited by examiner

DISPLAY PANEL WITH FLOW RATE REGULATING STRUCTURE FOR REGULATING FLOW RATE OF PROCESS LIQUID, METHOD FOR MANUFACTURING THE SAME, AND DISPLAY DEVICE

CROSS-REFERENCE TO RELATED APPLICATIONS

This application claims priority to Chinese Patent Application No. 202110239434.7 filed in China on Mar. 4, 2021, the entire contents of which are hereby incorporated by reference.

TECHNICAL FIELD

The present disclosure relates to the technical field of displays, and particularly relates to a display panel, a method for manufacturing a display panel, and a display device.

BACKGROUND

With the rapid development of science and technology, AMOLED (Active-matrix organic light-emitting diode) has become the mainstream of display technology in the future. The yield of small-size AMOLED panels such as mobile phones is close to that of a-Si LCD products, but the yield of large-size AMOLEDs, especially TV-type AMOLEDs, has been the bottleneck of large-scale mass production. Horizontal Mura (referring to a phenomenon that the brightness of display is uneven, resulting in a phenomenon of various marks) is a common refractory poor of the AMOLEDs, of which a occurrence rate exceeds 90%, it is visible to naked eyes under conditions of seeing specific pictures, only severity is different.

SUMMARY

An embodiment of the present disclosure provides a display panel which includes a display area and a peripheral area surrounding the display area, the display panel further includes:

at least two integrated chips located in the peripheral area of at least one side of the display area and arranged along the boundary direction of the display area; and at least one flow rate regulating structure, located between the at least two integrated chips and on a side of the at least two integrated chips remote from the display area, wherein the flow rate regulating structure is configured to regulate a flow rate of process liquid.

Optionally, the number of the integrated chips is 4 to 8, one flow rate regulating structure is provided between two adjacent integrated chips.

Optionally, the flow rate regulating structure includes: at least one first retaining wall and at least one second retaining wall, wherein each first retaining wall and each second retaining wall intersect at a side of the at least two integrated chips remote from the display area.

Optionally, the number of the first retaining walls is plural, the number of the second retaining walls is plural, the plurality of the first retaining walls are arranged in parallel in a first direction, and the plurality of the second retaining walls are arranged in parallel in a second direction.

Optionally, the flow rate regulating structure includes at least one third retaining wall and at least one fourth retaining wall, wherein at least one third retaining wall and at least one fourth retaining wall intersect and are distributed in a first grid-like structure which has a uniformly distributed grid density.

Optionally, the flow rate regulating structure includes at least one fifth retaining wall and at least one sixth retaining wall, wherein the at least one fifth retaining wall and at least one sixth retaining wall intersect and are distributed in a second grid-like structure which has a unevenly distributed grid density.

Optionally, the flow rate regulating structure includes: at least one seventh retaining wall and at least one eighth retaining wall, wherein each seventh retaining wall and each eighth retaining wall intersect at a side of the at least two integrated chips remote from the display area;

the flow rate regulating structure further comprises ninth retaining walls, at least one ninth retaining wall and the at least one seventh retaining wall intersect and are distributed in a third grid-like structure; and the at least one ninth retaining wall and the at least one eighth retaining wall intersect and are distributed in the third grid-like structure which has the unevenly distributed grid density.

Optionally, the grid density gradually decreases in a direction near a middle position of the flow rate regulating structure.

Optionally, the display panel includes a gate electrode layer, and the flow rate regulating structure is provided at the gate electrode layer.

A method for manufacturing a display panel, wherein the display panel includes the display area and the peripheral area surrounding the display area, the method for manufacturing the display panel includes:

manufacturing the at least two integrated chips in the peripheral area of at least one side of the display area, wherein the at least two integrated chips are arranged along the boundary direction of the display area;

manufacturing at least one flow rate regulating structure, wherein the flow rate regulating structure is located between the at least two integrated chips and on the side of the at least two integrated chips remote from the display area and the flow rate regulating structure is configured to regulate the flow rate of the process liquid.

A display device, which includes:

wherein the display panel includes:

a display area;

a peripheral area surrounding the display area;

at least two integrated chips located in the peripheral area of at least one side of the display area and arranged along the boundary direction of the display area; and at least one flow rate regulating structure, located between the at least two integrated chips and on a side of the at least two integrated chips remote from the display area, wherein the flow rate regulating structure is configured to regulate a flow rate of process liquid.

Optionally, the number of the integrated chips is 4 to 8, one flow rate regulating structure is provided between two adjacent integrated chips.

Optionally, the flow rate regulating structure includes: at least one first retaining wall and at least one second retaining wall, wherein each first retaining wall and each second retaining wall intersect at a side of the at least two integrated chips remote from the display area.

Optionally, the number of the first retaining walls is plural, the number of the second retaining walls is plural, the plurality of the first retaining walls are arranged in parallel in a first direction, and the plurality of the second retaining walls are arranged in parallel in a second direction.

Optionally, the flow rate regulating structure includes at least one third retaining wall and at least one fourth retaining wall, wherein at least one third retaining wall and at least one fourth retaining wall intersect and are distributed in a first grid-like structure which has a uniformly distributed grid density.

Optionally, the flow rate regulating structure includes at least one fifth retaining wall and at least one sixth retaining wall, wherein the at least one fifth retaining wall and at least one sixth retaining wall intersect and are distributed in a second grid-like structure which has a unevenly distributed grid density.

Optionally, the flow rate regulating structure includes: at least one seventh retaining wall and at least one eighth retaining wall, wherein each seventh retaining wall and each eighth retaining wall intersect at a side of the at least two integrated chips remote from the display area;

the flow rate regulating structure further comprises ninth retaining walls, at least one ninth retaining wall and the at least one seventh retaining wall intersect and are distributed in a third grid-like structure; and the at least one ninth retaining wall and the at least one eighth retaining wall intersect and are distributed in the third grid-like structure which has the unevenly distributed grid density.

Optionally, the grid density gradually decreases in a direction near a middle position of the flow rate regulating structure.

Optionally, the display device further includes a gate electrode layer, and the flow rate regulating structure is provided at the gate electrode layer.

DETAILED DESCRIPTION

The technical solution of embodiments of the present disclosure will now be described more fully hereinafter with reference to the accompanying drawings, in which some, but not all embodiments of the disclosure are shown. Based on the embodiments of the present disclosure, all other embodiments obtained by a person of ordinary skill in the art without inventive effort fall within the scope of protection of this disclosure.

Figure 1:
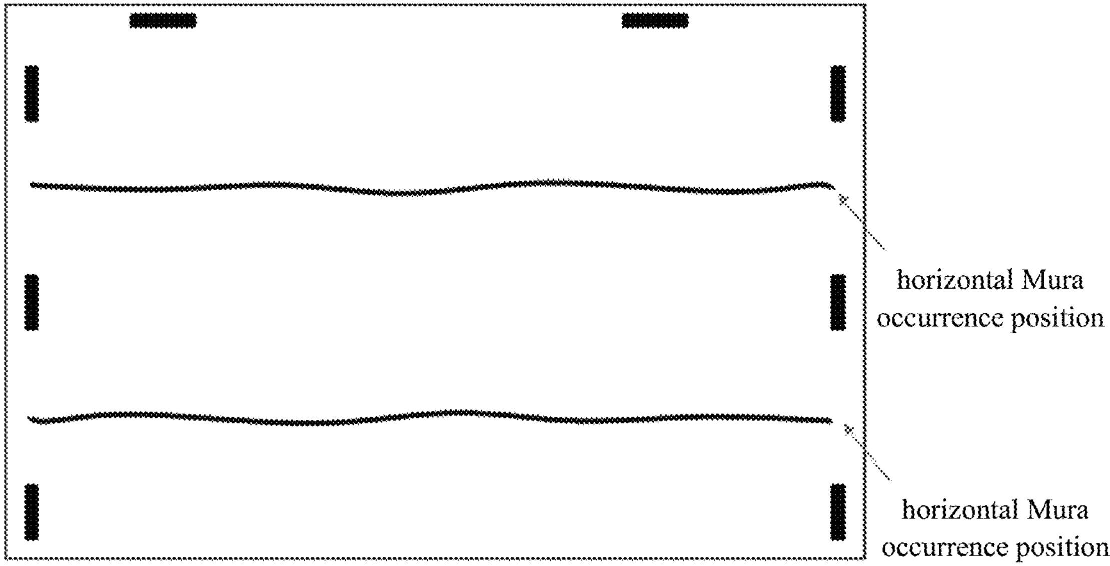
FIG. 1 is a schematic diagram of a horizontal Mura phenomenon in the related art.

In one embodiment of the present disclosure, the inventors of the present application, through poor analysis on the related art, found that the position where a horizontal Mura phenomenon (as shown in FIG. 1) occurs is located at the junction of two IC signal lines, and the horizontal Mura often occurs after a gate electrode is etched; therefore, after the studies of the inventors of the present application, the poor mechanism is inferred as: since there is an obvious dividing line at the junction of two IC signal lines in the related art, a division function of a dividing line affects the flow of etching liquid, a flow velocity of the etching liquid at the dividing line is significantly less than that in other areas, resulting in uneven concentration of the etching liquid at the upper and lower sides of the dividing line and resulting in slight fluctuations in process indexes such as a line width, and a macroscopic performance is that the horizontal Mura phenomenon appears at the dividing line. For the above-mentioned problems, various process adjustments in the related art, such as the management and control of the service life of the etching solution, the change of the transfer speed, etc. are not significantly improved, and at the end of the service life of the etching solution, there is even a deterioration phenomenon. In order to solve the above-mentioned problems, in the present disclosure, patterning of the IC signal lines interface is optimally designed, which can improve the flow of the process liquid, greatly reduce the generation of the Mura phenomenon, and also avoid the substantial modification of an AA display area, and the specific solutions are as follows.

Figure 2:
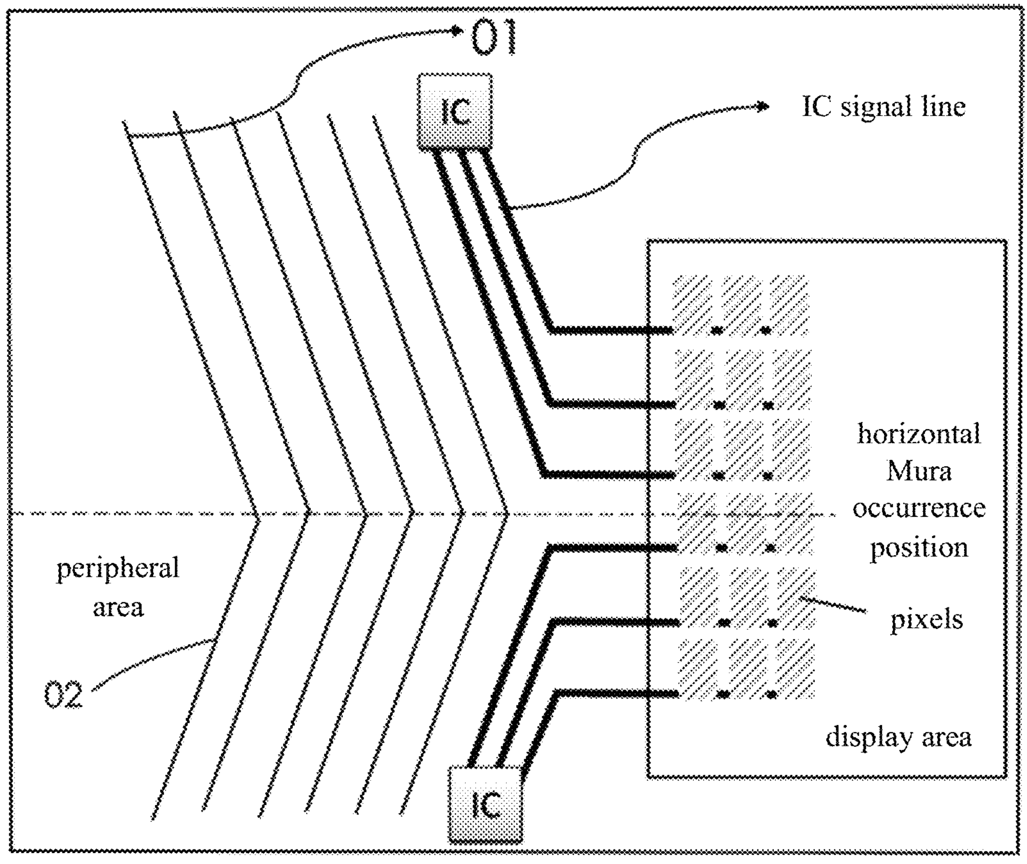
FIG. 2 is a schematic diagram of a flow rate regulating structure provided by an embodiment of the present disclosure.

FIG. 2 is a schematic diagram of a flow rate regulating structure provided by another embodiment of the present disclosure.

The embodiment provides a display panel which includes a display area and a peripheral area surrounding the display area, wherein the display area is used for implementing a display function, and the peripheral area of the display area has no display function. The display panel further includes at least two integrated chips which are arranged in the peripheral area of the display area and arranged along the boundary direction of the display area. At least one flow rate regulating structure, located between at least two integrated chips and on a side of the at least two integrated chips remote from the display area, wherein a flow rate regulating structure is configured to regulate a flow rate of process liquid. The peripheral area of the peripheral area of the display area includes the flow rate regulating structure, and one or more flow rate regulating structures can be selectively provided according to actual needs. The function of the flow rate regulating structure is to adjust the flow rate of the process liquid, which can speed up the flow rate of the process liquid at the IC signal line interface.

In one embodiment of the present disclosure, the number of the integrated chips can range between 4 to 8, optionally, the number of the integrated chips can be 4, 6, or 8, etc., and the number of integrated chips are not limited in the present disclosure. The flow rate regulating structure is provided between two adjacent integrated chips.

In one embodiment of the present disclosure, the flow rate regulating structure can include at least one first retaining wall 01 and at least one second retaining wall 02. As shown in FIG. 2, at least one first retaining wall 01 is linear and inclined towards the direction close to the integrated chips; at least one second retaining wall 02 is linear and inclined away from the integrated chips, wherein each first retaining wall 01 and one second retaining wall 02 intersect at a side of the at least two integrated chips away from the display area. The flow rate regulating structure with the structure design can weaken the division function of the boundary line at the IC signal line interface, promote the flow of the process liquid such as etching liquid, and ensure the uniformity of process indexes. The effect for improving the horizontal Mura with the flow rate regulating structure by using the first retaining wall 01 and the second retaining wall 02 is very significant, and the occurrence rate of the horizontal Mura is reduced from more than 90% to less than 5%.

In one embodiment of the present disclosure, the display panel includes a plurality of first retaining walls 01 and a plurality of second retaining walls 02, wherein the plurality of first retaining walls 01 are arranged in parallel in a first direction, and the plurality of second retaining walls 02 are arranged in parallel in a second direction. As shown in FIG. 2, the first direction is a direction vertically downwards and close to the display area and the second direction is a direction vertically downwards and away from the display area. Each first retaining wall 01 and one second retaining wall 02 intersect at the side of the at least two integrated chips away from the display area.

Figure 3:
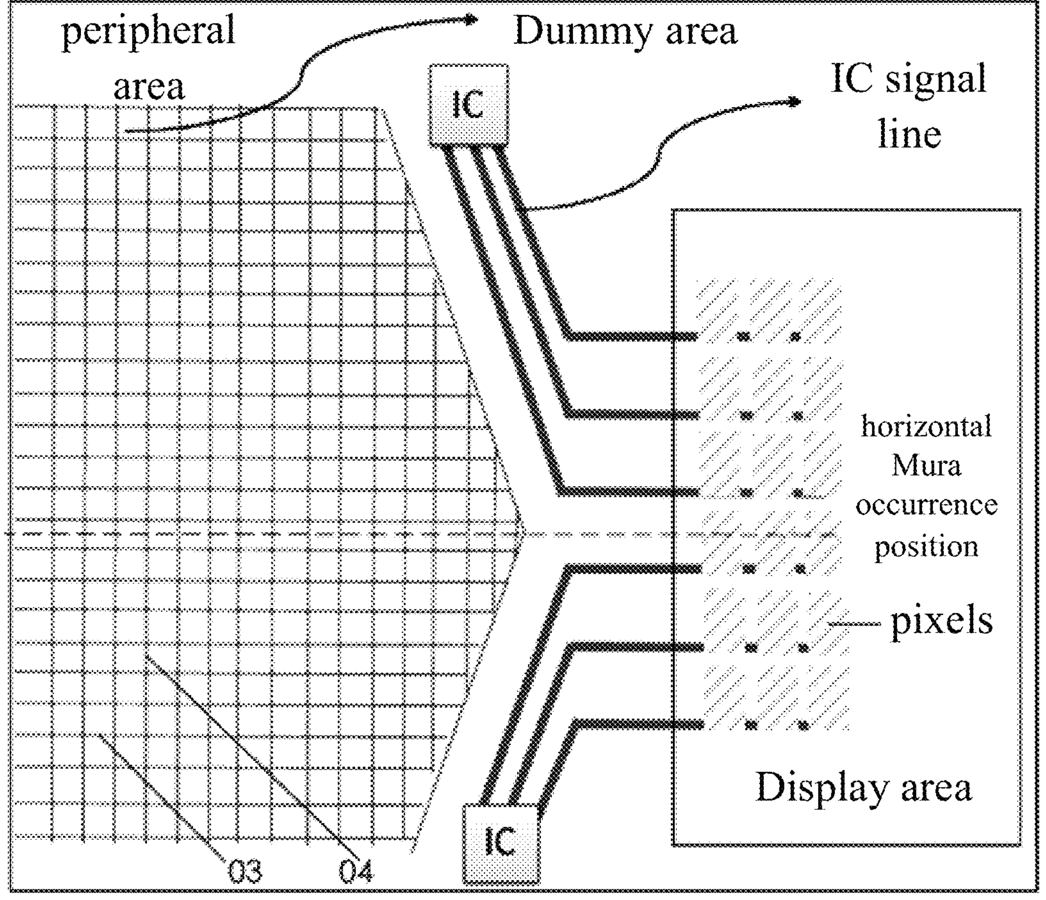
FIG. 3 is a schematic diagram of a flow rate regulating structure provided by another embodiment of the present disclosure.

FIG. 3 is a schematic diagram of a flow rate regulating structure provided by another embodiment of the present disclosure.

In one embodiment of the present disclosure, the flow rate regulating structure includes at least one third retaining wall 03 and at least one fourth retaining wall 04. The third retaining wall 03 is linear and distributed along the horizontal direction; the fourth retaining wall 04 is linear and is distributed along the vertical and horizontal directions; as shown in FIG. 3, at least one third retaining wall 03 and at least one fourth retaining wall 04 intersect and are distributed in a first grid-like structure which has a uniformly distributed grid density. By adopting the flow rate regulating structure which has the flow rate regulating structure described in the present embodiment, the flow rate of the process liquid can be uniform, the uniformity of the process indexes can be ensured, and the effect of improving the horizontal Mura is remarkable.

Figure 4:
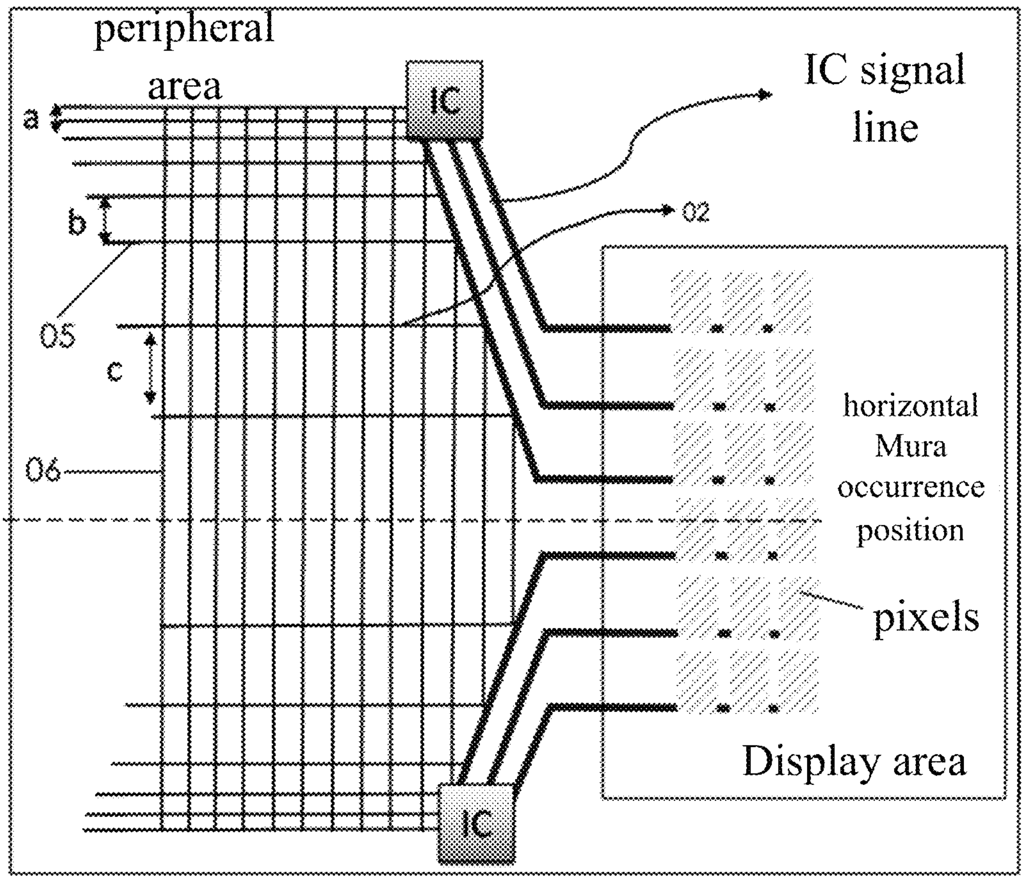
FIG. 4 is a schematic diagram of a flow rate regulating structure provided by another embodiment of the present disclosure.

FIG. 4 is a schematic diagram of a flow rate regulating structure provided by another embodiment of the present disclosure.

In one embodiment of the present disclosure, the flow rate regulating structure includes at least one fifth retaining wall 05 and at least one sixth retaining wall 06. The fifth retaining wall 05 is linear and distributed along the horizontal direction; the sixth retaining wall 06 is linear and is distributed along the vertical and horizontal directions; as shown in FIG. 4, at least one fifth retaining wall 05 and at least one sixth retaining wall 06 intersect and are distributed in a second grid-shaped structure which has an unevenly distributed grid density, and the grid density of the second grid-like structure can be set as an gradually changed grid density, and optionally, the second grid-like density gradually decreases in the direction close to the middle position of the flow rate regulating structure. By using the flow rate regulating structure which has the second grid structure described in the present embodiment, it is possible to quantitatively adjust the flow rate of liquid at the dividing line, and thus it is possible to further promote the realization of uniformity indexes.

Figure 5:
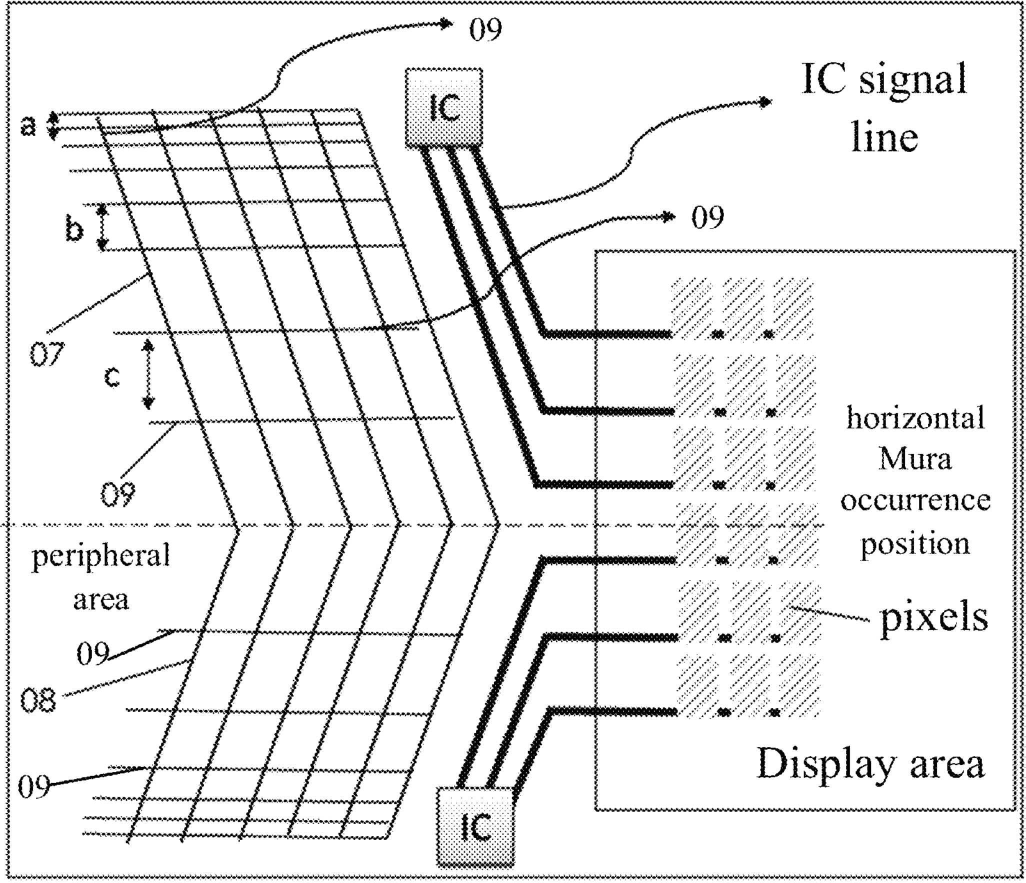
FIG. 5 is a schematic diagram of a flow rate regulating structure provided by another embodiment of the present disclosure.

FIG. 5 is a schematic diagram of a flow rate regulating structure provided by another embodiment of the present disclosure.

In one embodiment of the present disclosure, the flow rate regulating structure can include at least one seventh retaining wall 07 and at least one eighth retaining wall 08. At least one seventh retaining wall 07 is linear and inclined towards the direction close to the integrated chips; at least one eighth retaining wall 08 is linear and inclined away from the integrated chips, wherein each seventh retaining wall 07 and one eighth retaining wall 08 intersect at a side of the at least two integrated chips away from the display area. Optionally, the display panel includes a plurality of seventh retaining walls 07 and a plurality of eighth retaining walls 08, wherein the plurality of seventh retaining walls 07 are arranged in parallel in the first direction and the plurality of eighth retaining walls 08 are arranged in parallel in the second direction. As shown in FIG. 2, the first direction is a direction vertically downwards and close to the display area and the second direction is a direction vertically downwards and away from the display area.

The flow rate regulating structure further includes a ninth retaining wall 09, wherein the ninth retaining wall 09 is linear and distributed along the horizontal direction; at least one ninth retaining wall 09 and at least one seventh retaining wall 07 intersect to form a third grid-like structure distribution; at least one ninth retaining wall 09 intersects with at least one eighth retaining wall 08 in the third grid-like structure distribution; wherein the grid density of the third grid-shaped structure is unevenly distributed, the third grid-shaped structure can be set as the gradually changed grid density, and optionally, the third grid-shaped density gradually decreases in the direction close to the middle position of the flow rate regulating structure. By using the flow rate regulating structure which has the third grid structure described in the present embodiment, it is possible to quantitatively adjust the flow rate of liquid at the dividing line, and thus it is possible to further promote the realization of uniformity indexes.

By adopting the flow rate regulating structure with the third grid-like structure can not only weaken the division function of the IC signal line interface dividing line, promote the flow of the process liquid such as the etching liquid, and ensure the uniformity of the process indexes, but also quantitatively regulate the flow rate of the liquid at the dividing line, therefore the realization of the uniformity indexes can be more promoted, and a remaining adverse phenomenon when only using the flow rate regulating structure of the first retaining wall and the second retaining wall can be accurately improved.

In one embodiment of the present disclosure, the density of the second grid or the third grid can be gradually decreased in a direction near the middle position of the flow rate regulating structure, wherein, with reference to FIG. 4 or FIG. 5, a, b, and c are respectively spacing between adjacent fifth retaining walls or the spacing between adjacent seventh retaining walls, and the spacing between a, b, and c can be set to be different values and can refer to the hydrodynamic Bernoulli equation:

$$p+\frac{1}{2}\rho v2+\rho gh=C:$$

where p is pressure at a point in the fluid, v is a flow rate at the point in the fluid, ρ is the density of the fluid, g is acceleration of gravity, h is a height at the point, and C is a constant.

The liquid flow rate at the dividing line (including but not limited to $a<b<c$) is quantitatively adjusted which can more promote the realization of the homogenization indexes.

The flow rate regulating structure according to the above embodiments of the present disclosure is provided in the gate electrode layer or a polysilicon layer in the display panel. Since the horizontal Mura in the related art often occurs after the gate electrode is etched, the flow rate regulating structure which is arranged on the gate electrode or the polysilicon layer can directly accelerate the flow rate of the etching liquid at the boundary line during the process of forming the gate electrode layer and the polysilicon layer, the uniformity of the process indexes of the gate electrode layer and the polysilicon layer is improved, and the occurrence of the horizontal Mura is reduced.

In one embodiment, a method for manufacturing the display panel is provided, wherein the display panel includes the display area and the peripheral area surrounding the display area, at least two integrated chips are manufactured in the peripheral area of the display area, and the at least two integrated chips are arranged along the boundary direction of the display area; at least one flow rate regulating structure is manufactured, the flow rate regulating structure is located between two adjacent integrated chips and on the side of the integrated chips remote from the display area, and the flow rate regulating structure is configured to regulate the flow rate of the process liquid. The at least one flow rate regulating structure can adjust the flow of the process liquid such as the etching liquid, especially accelerate the flow rate of the process liquid at the IC signal line interface, so that the flow rate of the process liquid at the IC signal line interface is equal to the flow rate of the process liquid in other areas, so that the uniformity of the process indexes is improved and the horizontal Mura phenomenon is prevented.

In one embodiment, the method for manufacturing the display panel can further include the following steps:

providing a base substrate, which includes: a substrate layer and an inorganic layer provided on one side of the substrate layer;

successively forming the polysilicon layer, a first gate electrode insulating layer, and a gate electrode metal layer on the inorganic layer;

performing film plating on the gate electrode metal layer, and performing processes such as exposure and etching on the gate electrode metal layer by using a mask plate with a corresponding image so as to form at least one flow rate regulating structure in the peripheral area of the display area of the gate electrode metal layer; and successively forming other functional film layers on the side of the gate electrode metal layer away from the base substrate so as to complete the manufacturing of the display panel, and optionally, the functional film layers can include a second gate insulating layer, a capacitor metal layer, an insulating layer, a third metal layer, and a planarization layer, etc. wherein the specific type of the functional film layers can be set according to actual product requirements, and the present disclosure does not define the specific functional film layers.

By providing at least one flow rate regulating structure on the gate electrode layer and the polysilicon layer in the peripheral area of the display area of the display panel, not only weakens the division function of the IC signal line interface dividing line, promotes the flow of the process liquid such as the etching liquid, and ensures the uniformity of the process indexes, but also quantitatively regulates the flow rate of the liquid at the dividing line, therefore the realization of the uniformity indexes can be more promoted.

The present embodiment provides the display device, which includes the display panel as claimed in any one of the above-mentioned embodiments, wherein the display panel includes the display area and the peripheral area surrounding the display area, and the peripheral area surrounding the display area includes at least two integrated chips. The present disclosure is used for adjusting the flow rate of the process liquid by providing the flow rate regulating structure between the at least two integrated chips, and for adjusting the flow of the process liquid such as the etching liquid, in particular, accelerating the flow rate of the process liquid at the IC signal line interface, so that the flow rate of the process liquid at the IC signal line interface is equal to the flow rate of the process liquid at other areas. Therefore, the uniformity of process index can be improved and the phenomenon of the horizontal Mura can be prevented. The present embodiment not only solves the generation of a horizontal Mura-like bad phenomenon, but also enriches solutions for an AMOLED non-display area design.

It can be understood that the display device can be electronic devices such as a television, computer, etc. and the present disclosure does not limit the specific type of the display device.

The block diagrams of devices, apparatus, equipment, and systems referred to in this application are merely illustrative examples and are not intended to require or imply that the connections, arrangements, configurations must be made in the manner shown in the block diagrams. The devices, apparatus, equipment, and systems may be connected, arranged, and configured in any manner, as will be appreciated by those skilled in the art.

It is also noted that each component or step can be disassembled and/or recombined in the apparatus, equipment, and methods of the present application. Such disassembly and/or recombinations should be considered as equivalents to the present application.

The above descriptions about the disclosed aspects are provided to enable any skilled in the art to implement or use the application. Various modifications to these aspects will be readily apparent to those skilled in the art, and the generic principles defined herein can be applied to other aspects without departing from the scope of the application. Thus, the present application is not intended to be limited to the aspects shown herein but is to be accorded the widest scope consistent with the principles and novel features disclosed herein.

In the descriptions of the application, “multiple” means at least two, for example, two and three, unless otherwise limited definitely and specifically. All directional indications (such as up, down, left, right, front, rear, top, bottom) in the embodiments of the present application are only used to explain the relative positional relationship, motion, etc. Between the components at a particular attitude (as shown in the drawings), and if the particular attitude changes, the directional indication changes accordingly. In addition, terms “include” and “have” and any transformations thereof are intended to cover nonexclusive inclusions. For example, a process, method, system, product or device including a series of steps or units is not limited to the steps or units which have been listed but optionally further includes steps or units which are not listed or optionally further includes other steps or units intrinsic to the process, the method, the product or the device.

Further, reference herein to “embodiment” means that a particular feature, structure, or characteristic described in connection with the embodiment can be included in at least one embodiment of the present application. Each position where this phrase appears in the specification does not always refer to the same embodiment as well as an independent or alternative embodiment mutually exclusive to another embodiment. It is to be expressly and implicitly understood by one of ordinary skill in the art that the embodiments described herein can be combined with other embodiments.

The above embodiments are merely specific implementation modes of the present disclosure, but the scope of protection of the present disclosure is not limited thereto, and any modification and substitution be apparent to those skilled in the art without departing from the technical scope of the present disclosure shall covered by the scope protection of the present disclosure. Therefore, the scope of protection of the disclosure shall be subject to the scope of protection of the claims. The content described above is just the preferred embodiments of the present disclosure, any modifications, equivalent replacements the like made within the spirit and principle of the disclosure shall fall within the scope of protection of the disclosure.

The content described above is just the preferred embodiments of the present disclosure, any modifications, equivalent replacements the like made within the spirit and principle of the disclosure shall fall within the scope of protection of the disclosure.

What is claimed is:

1. A display panel, comprising:

a display area;

a peripheral area surrounding the display area, wherein the peripheral area abuts one sides of the display area;

at least two integrated chips located in the peripheral area of at least one side of the display area and arranged along a boundary direction of the display area, wherein the boundary is a boundary close to a side of the at least two integrated chips; and at least one flow rate regulating structure, located between the at least two integrated chips and on a side of the at least two integrated chips remote from the display area, wherein the flow rate regulating structure is configured to regulate a flow rate of process liquid;

wherein the flow rate regulating structure comprises: at least one seventh retaining wall and at least one eighth retaining wall, wherein each seventh retaining wall and each eighth retaining wall intersect at a side of the at least two integrated chips remote from the display area;

the flow rate regulating structure further comprises ninth retaining walls, at least one ninth retaining wall and the at least one seventh retaining wall intersect and are distributed in a third grid-like structure; and the at least one ninth retaining wall and the at least one eighth retaining wall intersect and are distributed in the third grid-like structure which has an unevenly distributed grid density;

wherein a plurality of the seventh retaining walls are arranged in parallel in a first direction and a plurality of the eighth retaining walls are arranged in parallel in a second direction, the first direction is a direction pointing vertically-downwards and towards the display area and the second direction is a direction pointing vertically downwards and away from the display area.

2. The display panel according to claim 1, wherein the number of the integrated chips is 4 to 8, and one flow rate regulating structure is provided between two adjacent integrated chips.

3. The display panel according to claim 1, further comprising a gate electrode layer, wherein the flow rate regulating structure is provided at the gate electrode layer.

4. A method for manufacturing a display panel, wherein the display panel comprises a display area and the peripheral area surrounding the display area, and the peripheral area abuts all one sides of the display area, the manufacturing method of the display panel comprises:

manufacturing the at least two integrated chips in the peripheral area of at least one side of the display area, wherein the at least two integrated chips are arranged along a boundary direction of the display area, and the boundary is a boundary close to a side of the at least two integrated chips;

manufacturing at least one flow rate regulating structure, wherein the flow rate regulating structure is located between the at least two integrated chips and on the side of the at least two integrated chips remote from the display area and the flow rate regulating structure is configured to regulate the flow rate of the process liquid;

wherein the flow rate regulating structure comprises: at least one seventh retaining wall and at least one eighth retaining wall, wherein each seventh retaining wall and each eighth retaining wall intersect at a side of the at least two integrated chips remote from the display area;

the flow rate regulating structure further comprises ninth retaining walls, at least one ninth retaining wall and the at least one seventh retaining wall intersect and are distributed in a third grid-like structure; and the at least one ninth retaining wall and the at least one eighth retaining wall intersect and are distributed in the third grid-like structure which has an unevenly distributed grid density;

wherein a plurality of the seventh retaining walls are arranged in parallel in a first direction and a plurality of the eighth retaining walls are arranged in parallel in a second direction, the first direction is a direction pointing vertically downwards and towards the display area and the second direction is a direction pointing vertically downwards and away from the display area.

5. A display device, comprising a display panel;

wherein the display panel comprises:

a display area;

a peripheral area surrounding the display area, wherein the peripheral area abuts one sides of the display area;

at least two integrated chips located in the peripheral area of at least one side of the display area and arranged along a boundary direction of the display area, wherein the boundary is a boundary close to a side of the at least two integrated chips; and at least one flow rate regulating structure, located between the at least two integrated chips and on a side of the at least two integrated chips remote from the display area, wherein the flow rate regulating structure is configured to regulate a flow rate of process liquid;

wherein the flow rate regulating structure comprises: at least one seventh retaining wall and at least one eighth retaining wall, wherein each seventh retaining wall and each eighth retaining wall intersect at a side of the at least two integrated chips remote from the display area;

the flow rate regulating structure further comprises ninth retaining walls, at least one ninth retaining wall and the at least one seventh retaining wall intersect and are distributed in a third grid-like structure; and the at least one ninth retaining wall and the at least one eighth retaining wall intersect and are distributed in the third grid-like structure which has an unevenly distributed grid density;

wherein a plurality of the seventh retaining walls are arranged in parallel in a first direction and a plurality of the eighth retaining walls are arranged in parallel in a second direction, the first direction is a direction pointing vertically downwards and towards the display area and the second direction is a direction pointing vertically downwards and away from the display area.

6. The display device according to claim 5, wherein the number of the integrated chips is 4 to 8, and one flow rate regulating structure is provided between two adjacent integrated chips.

7. The display device according to claim 5, further comprising a gate electrode layer, wherein the flow rate regulating structure is provided at the gate electrode layer.

* * * * *